United States Patent
Aitken et al.

(10) Patent No.: US 7,935,609 B2
(45) Date of Patent: May 3, 2011

(54) METHOD FOR FABRICATING SEMICONDUCTOR DEVICE HAVING RADIATION HARDENED INSULATORS

(75) Inventors: John M. Aitken, South Burlington, VT (US); Ethan H. Cannon, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 336 days.

(21) Appl. No.: 12/186,750

(22) Filed: Aug. 6, 2008

(65) Prior Publication Data

US 2010/0035393 A1   Feb. 11, 2010

(51) Int. Cl.
*H01L 21/76* (2006.01)
(52) U.S. Cl. ........ 438/425; 438/443; 438/459; 438/474; 438/479; 257/347; 257/E21.249; 257/E21.563
(58) Field of Classification Search .......... 438/149, 438/150, 160, 425, 443, 444, 458, 459, 474, 438/476, 477, 479; 257/E21.561, E21.563, 257/E21.249, 347
See application file for complete search history.

(56) References Cited

U.S. PATENT DOCUMENTS

| 5,304,840 | A | 4/1994 | Cable |
| 5,360,752 | A | 11/1994 | Brady et al. |
| 5,589,708 | A | 12/1996 | Kalnitsky |
| 5,795,813 | A | 8/1998 | Hughes et al. |

OTHER PUBLICATIONS

A. W. Topol, "Three-dimensional integrated circuits"; IBM j. Res. And Dev. vol. 50 No. 4/5; Jul./Sep. 2006.

*Primary Examiner* — Thanh V Pham
(74) *Attorney, Agent, or Firm* — Richard Kotulak; Roberts Mlotkowski Safran & Cole, P.C.

(57) ABSTRACT

A method is provided for fabricating a semiconductor device and more particularly to a method of manufacturing a semiconductor device having radiation hardened buried insulators and isolation insulators in SOI technology. The method includes removing a substrate from an SOI wafer and selectively removing a buried oxide layer formed as a layer between the SOI wafer and active regions of a device. The method further comprises selectively removing isolation oxide formed between the active regions, and replacing the removed buried oxide layer and the isolation oxide with radiation hardened insulators.

20 Claims, 5 Drawing Sheets

METHOD FOR FABRICATING SEMICONDUCTOR DEVICE HAVING RADIATION HARDENED INSULATORS

CROSS-REFERENCE TO RELATED APPLICATIONS

This application is related to U.S. Ser. No. 12/186,762 filed on the same day and currently pending.

FIELD OF THE INVENTION

The present invention generally relates to a method for fabricating a semiconductor device and more particularly to a method of manufacturing a semiconductor device having radiation hardened buried insulators and isolation insulators in SOI technology.

BACKGROUND

Ionizing radiation can cause total failure resulting from total dose (long accumulation of radiation) in semiconductor ICs. In high radiation environments, such as space applications, ionizing radiation creates trapped charge and interface states in dielectric layers. That is, due to prolonged radiation exposure (total dose) a charge can build up at an interface between an oxide and SOI devices. This build up will eventually change the charge flow at the SOI interface. For example, trapped charge in the buried oxide (BOX) leads to increased backgate leakage and trapped charge in the STI increases leakage through the sidewall device. If the backgate or sidewall threshold voltage is allowed to move far enough from the design point, the circuitry can fail to operate.

Methods to prevent total dose effects include hardening the STI or BOX individually, which only addresses one possible means of failure. Consequently, there is a need to improve protection schemes from radiation events in ICs.

Accordingly, there exists a need in the art to overcome the deficiencies and limitations described hereinabove.

SUMMARY

In a first aspect of the invention, a method comprises removing a substrate from an SOI wafer and selectively removing a buried oxide layer formed as a layer between the SOI wafer and active regions of a device. The method further comprises selectively removing isolation oxide formed between the active regions, and replacing the removed buried oxide layer and the isolation oxide with radiation hardened insulator, such as radiation hardened oxide.

In a second aspect of the invention, a method of forming a radiation hardened structure comprises: forming a BOX layer on a substrate; forming a Si layer with active regions on the BOX, including gate structures with accompanying source and drain regions; forming STI structures between the active regions of the Si layer, the STI structures being filled with oxide; forming metal interconnects in one or more interlevel dielectric layers above the gates structures; removing the substrate; selectively removing the BOX and oxide from the STI structures; and depositing radiation hardened insulator, such as radiation hardened oxide, in the STI structures and replacing the BOX with radiation hardened insulator, such as radiation hardened oxide.

In a third aspect of the invention, a method of forming a radiation hardened structure comprises removing a substrate and BOX layer from SOI technology and removing oxide from STI structures between active regions of the SOI technology. The method further comprises depositing radiation hardened insulator, such as radiation hardened oxide, in the STI structures and replacing the BOX with radiation hardened insulator, such as radiation hardened oxide.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The present invention generally relates to a method for fabricating a semiconductor device and more particularly to a method of manufacturing a semiconductor device having radiation hardened insulator, such as radiation hardened oxide, to replace buried oxide and isolation oxides in SOI technology. The radiation hardened insulator formed in the STI structure and BOX will prevent a charge build up at the interface between an insulator (STI or BOX) and the SOI devices due to prolonged radiation exposure (total dose) thus preventing a change in the charge flow at the SOI interface.

In embodiments, after an SOI wafer is processed including the formation of active devices separated by STI regions and interlevel dielectrics with metallization, for example, the substrate is removed to expose a BOX. The BOX and STI are then removed by a selective etch. A radiation hardened insulator, such as a radiation hardened oxide, is formed in the isolation trenches and below the active device layer, forming radiation hardened STI and BOX. In embodiments, the BOX is planarized. Advantageously, the processes of the invention are compatible with known 3D processes to form 3D integrated circuits. Compared to existing methods to harden buried and isolation oxides, this method has the advantage of hardening both the BOX and STI together.

Method of Forming Structures in Accordance with the Invention

Figure 1:
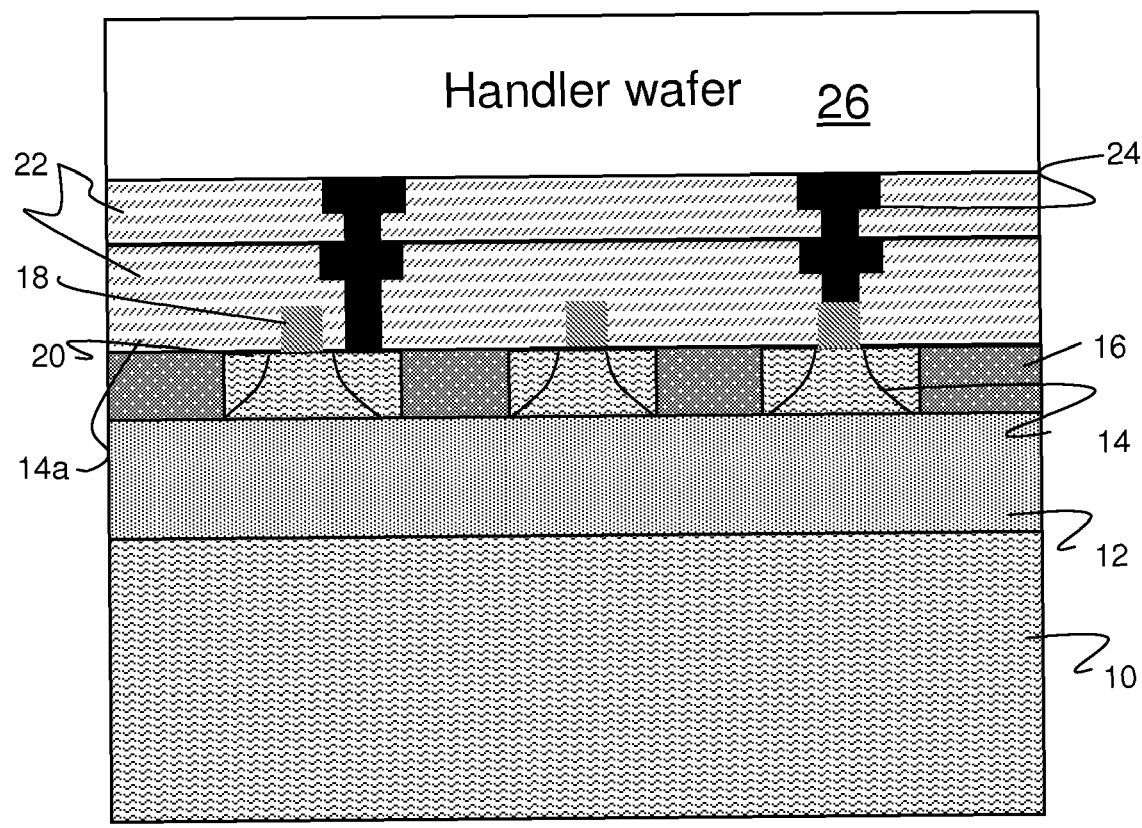
FIGS. 1 and 2 show structures and respective processing steps in accordance with the invention.

FIG. 1 shows a beginning structure and respective processing steps in accordance with a first aspect of the invention. Specifically, FIG. 1 shows a BOX 12 formed on a wafer 10 such as, for example, a silicon substrate. In embodiments, the substrate 10 can be a few hundred microns and the BOX 12 can range from about 50 nm to 250 nm. As the structure thus far described is a conventional and commercially available structure, no further explanation is required herein.

Still referring to FIG. 1, a Si layer 14 is deposited on the BOX 12 in a conventional manner. The Si layer 14 may range from about 20 nm to 250 nm, depending on the technology, and will form the active regions of the device (active device layer). For example, the Si layer 14 may be about 20 nm to 100 nm for 45 nm technology; whereas, it may be increased upwards to about 250 nm for 130 nm or 150 nm technology. In an optional embodiment, a nitrogen layer 14a can be deposited on the Si 14 as an etch stop layer.

In conventional lithographic and etching processes, shallow trenches are formed in the structure and more specifically in the Si layer 14. For example, a photolithographic masking layer (not shown) can be exposed to light to form openings, with a subsequent etching process (e.g., reactive ion etching (RIE)) to form the shallow trenches. A wet or dry resist/arc strip is used to remove the remains of the masking material. The shallow trenches will be used to form shallow trench isolation (STI) structures 16 which are filled with oxide material.

In conventional processing steps, a gate structure 18 and source and drain regions 20 are formed on the structure (above and in the active regions). The gate structure 18 may include, for example, a polysilicon gate formed on an oxide layer. The gate structure 18 may also include sidewalls/spacers comprising nitride or oxide or a combination thereof. The source and drain regions 20 may be formed using conventional doping methodologies, which do not need further explanation herein.

Interlevel dielectrics 22 are formed over the gate structure 18 and source and drain regions 20. Although two levels 22 are shown in FIG. 1, it should be understood by those of skill in the art that more or less than two levels are also contemplated by the invention, depending on a particular application. Metal interconnects 24 are formed in the dielectrics 22 using conventional damascene or dual damascene processes. The metal interconnects may be in contact with the source/drain regions and/or the gates, depending on a particular application.

FIG. 1 also shows a handler wafer 26 attached to the structure. The handler wafer 26 can be bonded to the structure in a conventional process.

Figure 2:
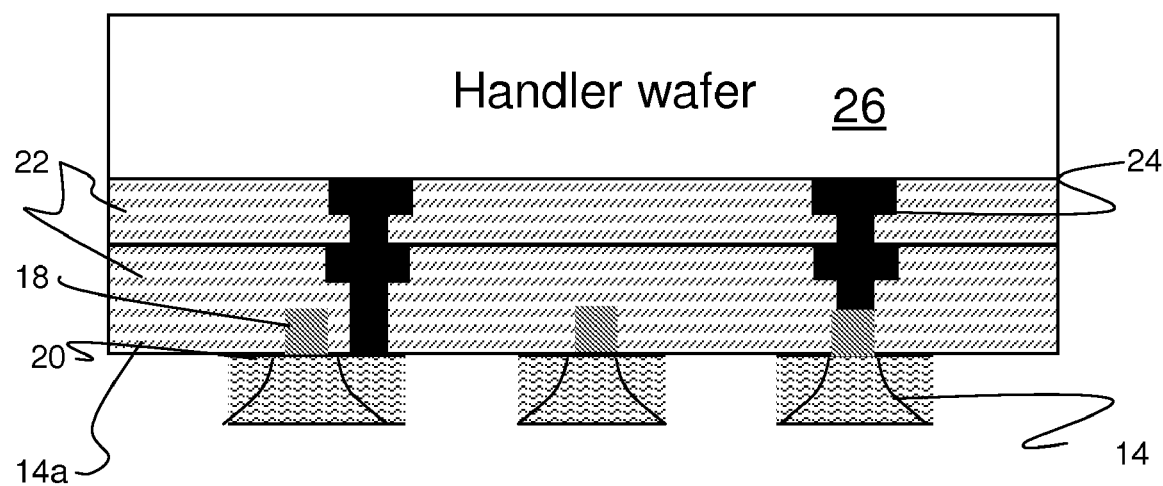

FIG. 2 shows an intermediate structure and processing steps in accordance with the invention. As shown in FIG. 2, the substrate 10, BOX 12 and STI structures 16, e.g., oxide, are removed using conventional processes. For example, the substrate 10 will be removed using a grinding and selective etching process. The BOX 12 and STI structures 16, e.g., oxide, are removed using a selective oxide etch. The nitrogen layer 14a may act as an etch stop to ensure that the etching of the BOX 12 and the STI structures 16 do not damage any other layers of the structure.

Figure 3:
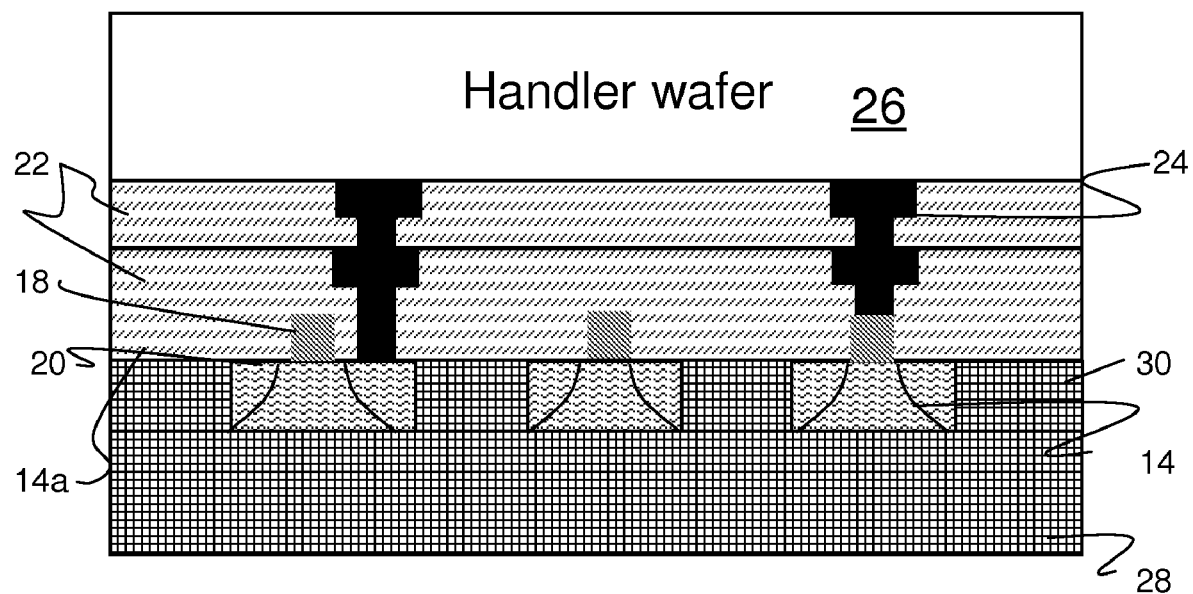
FIG. 3 shows a final structure and respective processing steps in accordance with the invention.

FIG. 3 shows a final structure and respective processing steps in accordance with the invention. Specifically, in FIG. 3, a radiation hardened insulator is deposited to form a radiation hardened BOX layer 28 and radiation hardened STI structures 30. The radiation hardened insulator may be, for example, a radiation hardened oxide or a silicon rich oxide material. The deposition process may be a conventional CVD process. The BOX layer 28 can then be planarized using conventional processes. Advantageously, the radiation hardened insulator will not accumulate a charge in an ionizing environment thereby protecting the device from trapped charges which can lead to backgate leakage and increased leakage through the sidewall device.

In embodiments, the radiation hardened BOX layer 28 may be about 50 nm to 250 nm thick, depending on the technology. Also, due to the thickness of the Si layer 14, the radiation hardened STI structures 30 may be about 20 nm to 100 nm for 45 nm technology; whereas, it may be increased upwards to about 250 nm for 130 nm or 150 nm technology.

Figure 4:
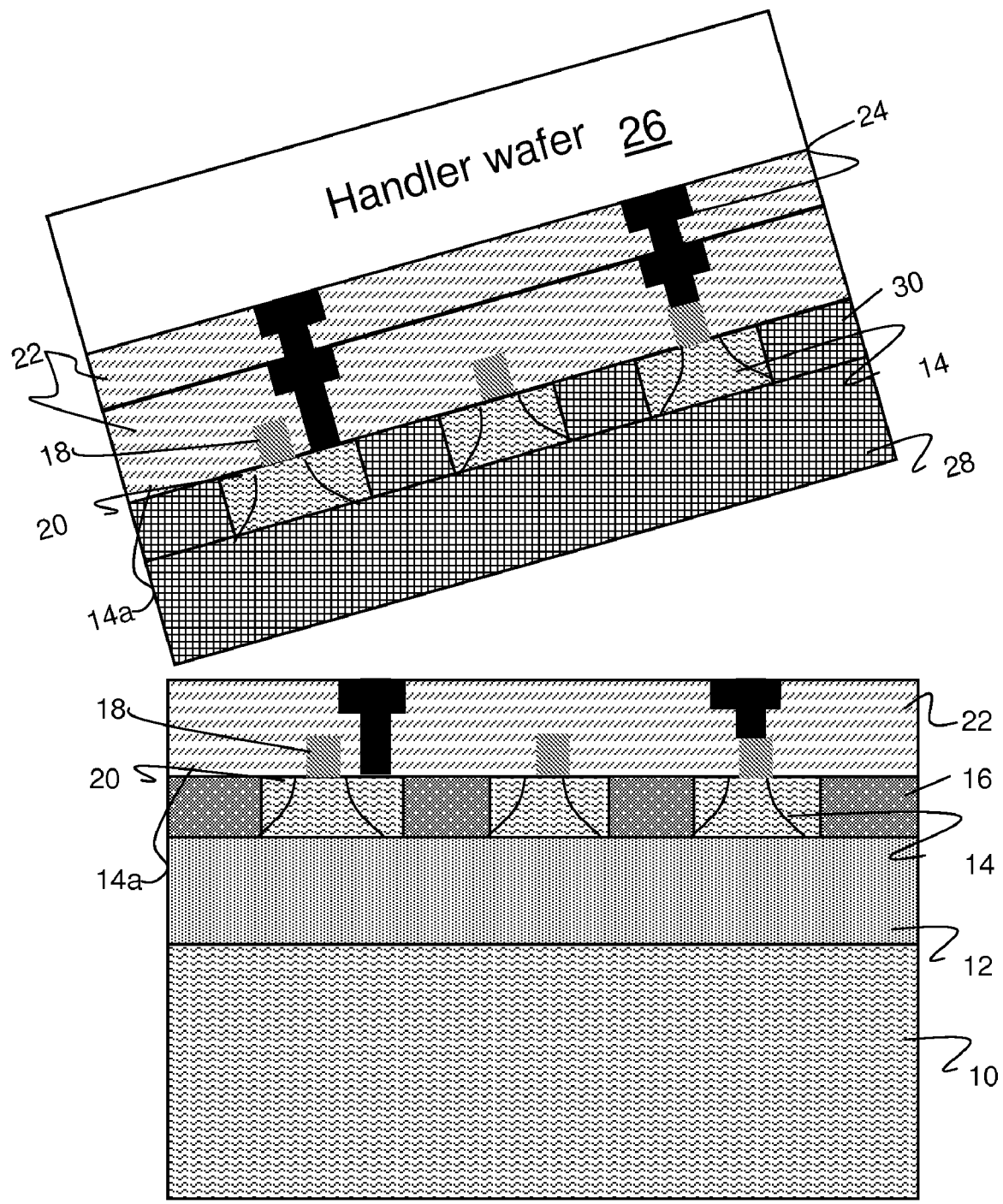
FIG. 4 shows alternate processing steps to form an alternate final structure in accordance with the invention.

FIG. 4 shows an additional processing step to form a three dimensional structure in accordance with the invention. Specifically, FIG. 4 shows a stacking process using the structures of FIG. 1 and FIG. 3, for example. In FIG. 4, the BOX and STI of the lower wafer may be radiation-hardened by the method of this invention, forming a 3D structure wherein all STI and BOX layers are radiation-hardened. Alternatively, the wafer-stacking process in FIG. 4 may be applied successively to form 3D structures with three or more active device layers. Alternatively, the structures may include more or less interlevel dielectrics and related metal interconnects. The stacking of the structures can advantageously be used with International Business Machine Corp.'s 3D assembly process as disclosed in "Three-dimensional integrated circuits", by A. W. Topol et al. IBM J. RES. & DEV. Vol. 50, No. 4/5, July/September 2006, the contents of which are expressly incorporated by reference in its entirety herein.

Figure 5:
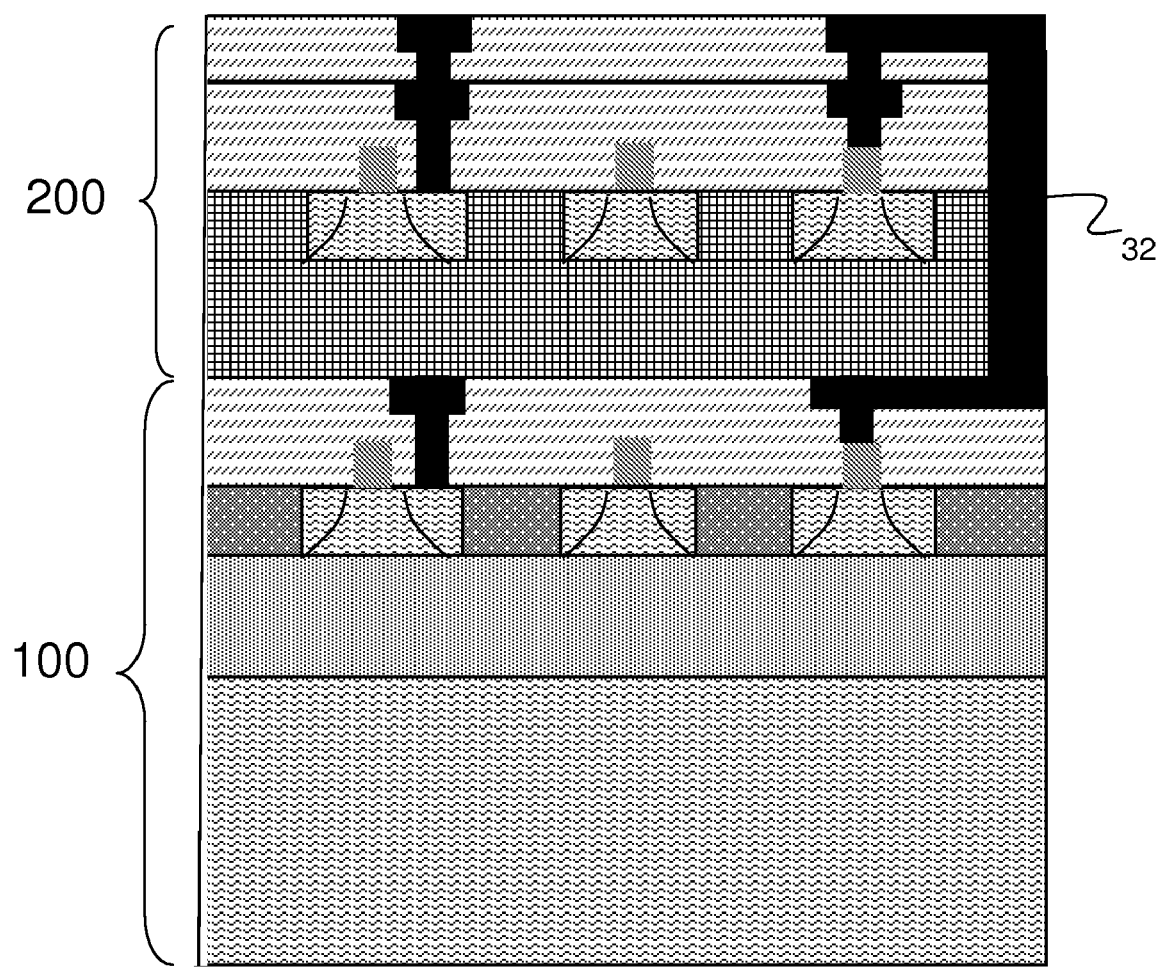
FIG. 5 shows an alternate final structure and respective processing steps in accordance with the invention.

FIG. 5 shows a stacked structure in accordance with the invention. In particular, the stacked structure can include the structures 100 and 200 shown in FIG. 1 and FIG. 3, respectively (including using more or less interlevel dielectric layers). The structures 100 and 200 may be bonded by one or more insulator or dielectric layers. The structures 100 and 200 are electrically connected by an interlevel wiring 32, formed through conventional etching and deposition methodologies.

The advantage of the structure of FIG. 5 is that sensitive circuits can be designed into the structure 200 of FIG. 3 (to prevent trapped charges) and less sensitive devices can be selectively designed into the structure 100 of FIG. 1. This can considerably reduce fabrication time and cost for applications that require radiation hardened materials. This also provides the advantage of having higher density devices, as the stack can include two or more structures.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method of forming a radiation hardened structure comprising:
   removing a substrate and BOX layer from a wafer made with SOI technology;
   removing oxide from STI structures between active regions of the wafer made with SOI technology; and
   depositing radiation hardened insulator in the STI structures and replacing the BOX with radiation hardened insulator.

2. The method of claim 1, wherein:
   the removing the substrate is at least by a grinding; and
   the removing the BOX and the oxide in the STI structures is by a selective etching process after the removing of the substrate.

3. The method of claim 1, further comprising bonding the radiation hardened structure to a non-radiation hardened structure by an oxide bonding technique.

4. The method of claim 3, further comprising radiation-hardening the non-radiation hardened structure by
   removing a substrate and BOX layer from wafer made with SOI technology;
   removing oxide from STI structures between active regions of the SOI technology; and
   depositing radiation hardened insulator in the STI structures and replacing the BOX with radiation hardened insulator.

5. A method, comprising:
   removing a substrate from an SOI wafer;
   selectively removing a buried oxide layer formed as a layer between the SOI wafer and active regions of a device;
   selectively removing isolation oxide formed between the active regions; and
   replacing the removed buried oxide layer and the isolation oxide with radiation hardened insulator.

6. The method of claim 5, wherein said radiation hardened insulator is a radiation hardened oxide.

7. The method of claim 6, wherein the radiation hardened oxide is formed by depositing a silicon rich oxide using a chemical vapor deposition process (CVD).

8. The method of claim 5, wherein the radiation hardened insulator forms a radiation hardened BOX layer.

9. The method of claim 8, wherein the radiation hardened insulator forms shallow trench isolation structures between the active regions.

10. The method of claim 5, further comprising protecting interlevel dielectric from the selectively removing process by a nitrogen etch stop layer.

11. The method of claim 5, wherein the removing the substrate includes a grinding process and a selective etching process.

12. The method of claim 5, further comprising forming a three dimensional structure by placing a first structure formed by the method of claim 1 onto an SOI device with non-radiation hardened components and electrically connecting said first structure to the SOI device by a metal interconnect.

13. The method of claim 12, further comprising radiation-hardening the non-radiation hardened components by
   removing a substrate from the non-radiation hardened SOI components;
   selectively removing a buried oxide layer formed as a layer between the non-radiation hardened SOI components and active regions of a device;
   selectively removing isolation oxide formed between the active regions; and
   replacing the removed buried oxide layer and the isolation oxide with radiation hardened insulator.

14. A method of forming a radiation hardened structure comprising:
   forming a BOX layer on a substrate:
   forming a Si layer with active regions on the BOX layer, the active layers including gate structures with accompanying source and drain regions;
   forming STI structures between the active regions of the Si layer, the STI structures being filled with oxide;
   forming metal interconnects in one or more interlevel dielectric layers above the gates structures;
   removing the substrate;
   selectively removing the BOX layer and oxide from the STI structures; and
   depositing radiation hardened insulator in the STI structures and replacing the BOX layer with radiation hardened insulator.

15. The method of claim 14, wherein the depositing of the radiation hardened insulator is provided by depositing a radiation hardened oxide by a CVD process.

16. The method of claim 14, wherein the radiation hardened insulator is formed by depositing a silicon rich oxide using a chemical vapor deposition process (CVD).

17. The method of claim 14, wherein the removing the substrate is performed through a grinding and a selective etching process.

18. The method of claim 14, further comprising protecting the one or more interlevel dielectric layers during the selectively removing the BOX layer and oxide.

19. The method of claim 14, further comprising bonding the radiation hardened structure to a non-radiation hardened structure.

20. The method of claim 19, further comprising radiation-hardening the non-radiation hardened structure by
   removing a substrate of the non-radiation hardened structure;
   selectively removing a BOX layer and oxide from STI structures; and
   depositing radiation hardened insulator in the STI structures and replacing the BOX layer with radiation hardened insulator.

* * * * *